(12) United States Patent
Coban et al.

(10) Patent No.: US 8,604,884 B2
(45) Date of Patent: Dec. 10, 2013

(54) VCO INSENSITIVE TO POWER SUPPLY RIPPLE

(75) Inventors: Abdulkerim L. Coban, Austin, TX (US); Ravi Kummaraguntla, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/174,251

(22) Filed: Jun. 30, 2011

(65) Prior Publication Data

US 2013/0002361 A1    Jan. 3, 2013

(51) Int. Cl.
*H03K 3/03*    (2006.01)
*H03L 1/00*    (2006.01)

(52) U.S. Cl.
USPC ............................................. 331/57; 331/186

(58) Field of Classification Search
USPC ................. 331/45, 57, 182, 183, 185, 186
See application file for complete search history.

(56) References Cited

U.S. PATENT DOCUMENTS

| | | | | |
|---|---|---|---|---|
| 5,748,048 A | * | 5/1998 | Moyal | 331/34 |
| 7,154,352 B2 | * | 12/2006 | Smith et al. | 331/185 |
| 7,391,274 B2 | * | 6/2008 | Hsu | 331/57 |
| 7,391,276 B2 | * | 6/2008 | Sakaguchi | 331/57 |
| 7,560,998 B2 | * | 7/2009 | Ohta et al. | 331/57 |
| 7,633,347 B2 | * | 12/2009 | Tan et al. | 331/16 |
| 7,710,207 B2 | * | 5/2010 | Wu | 331/57 |
| 2011/0316639 A1 | * | 12/2011 | Fischette | 331/183 |

* cited by examiner

*Primary Examiner* — Levi Gannon
(74) *Attorney, Agent, or Firm* — Abel Law Group, LLP

(57) ABSTRACT

A ring oscillator that is more insensitive to power supply ripple utilizes an amplifier circuit having a first input coupled to a reference voltage. A current is generated that represents a control voltage supplied to the oscillator control circuit. That current is mirrored and supplied as a control current to the oscillator. An amplifier is used in a feedback loop to ensure that incremental variations in source to drain voltage of a first transistor of the current mirror is present in a second transistor of the current mirror to make the control current more immune to supply ripple.

19 Claims, 11 Drawing Sheets

VCO INSENSITIVE TO POWER SUPPLY RIPPLE

BACKGROUND

1. Field of the Invention

This invention relates to an oscillator and more particularly to an oscillator that is insensitive to power supply ripple.

2. Description of the Related Art

In conventional phase-locked loops (PLLs) when high-supply ripple immunity is required typically more than one level of regulation is employed. As a consequence, the PLL operates from high-supply voltages (typically 2.5V to 3.3V range) and therefore increases power dissipation. Conversely, when high-supply voltage is not readily available, in presence of supply ripple, the PLL output clock spectrum will not be clean and contain spurs (or equivalently, the time domain clock waveform will have supply-induced jitter). The voltage controlled oscillator (VCO) block in the PLL may be particularly sensitive to supply ripple.

FIG. 1 illustrates a conventional PLL. An input signal having a frequency $f_{in}$ is supplied to an input divider 101. The output of the input divider 101 is supplied to the phase/frequency detector (PFD) 103 that compares the divided down input signal to a feedback signal from a feedback divider 105. The output of the PFD is used to adjust the charge pump output current pulse width 107, which supplies the VCO whose output frequency is tuned according to the charge pump output.

In order to reduce supply ripple induced spurs, various regulation schemes are used. In one scheme, referring to FIG. 2, only a single regulator 201 is used for the entire PLL 100. At the other extreme, as shown in FIG. 3, every PLL block has its own dedicated regulator. In large mixed-signal chips where there is a large noisy digital section, it is difficult to keep the PLL supply clean. External switching regulators, e.g., DC-DC converters, can also contribute significantly to the supply ripple. FIG. 4 depicts the output clock spectrum of a PLL with frequency $f_0$ for a sinusoidal supply ripple at frequency $f_{ripple}$. As shown in FIG. 5, regulating the supply voltage with regulator 501 reduces the VCO output spurs as compared to the unregulated case shown in FIG. 4.

In some cases where spur requirements are stringent, more than one level of regulation is needed as illustrated in FIG. 6. In such a case, due to regulator head-room requirements, the supply voltage needs to be increased. The first regulator 601 supplies an intermediate supply voltage (vreg1) of, e.g., 1.8V to 2.5V. The second regulator 603 supplies a supply voltage (vreg2) of 1.2V for use by the PLL 605. However, increasing the supply voltage leads to wasted power consumption, as other circuits in the system may also be connected to the supply voltage.

The above described deficiencies of conventional PLLs are merely intended to provide an overview of some of the problems of current technology and are not intended to be exhaustive. Other problems with the state of the art and corresponding benefits of various embodiments described herein may become further apparent upon review of the following detailed description.

SUMMARY

Accordingly, embodiments described herein provide a PLL having a ring oscillator-based VCO, with improved power supply ripple immunity without the need for high-supply voltage and reduced requirements for regulation.

In an embodiment an apparatus is provided that includes an amplifier circuit having a first input coupled to a reference voltage. A first transistor provides a first current to be mirrored that is indicative of a control voltage. A first current carrying terminal of the first transistor is coupled to a power supply, a second current carrying terminal of the first transistor is coupled to a second input of the amplifier circuit and the first transistor has a gate terminal coupled to an output of the amplifier circuit. A second transistor is coupled to supply a mirrored current corresponding to the first current and has a gate terminal coupled to a gate terminal of the first transistor and the output of the amplifier circuit. The second transistor has a first current carrying terminal coupled to the power supply.

In another embodiment a method is provided that includes supplying a control voltage to a gate of a first transistor. A first current is generated that is based on the control voltage and flows through a second transistor coupled between a voltage supply node and the first transistor. The first current is mirrored to generate a second current in a third transistor. The gate voltage of the second and third transistors is adjusted in response to noise present in a voltage on the voltage supply node to reduce variations in the second current from a desired value that corresponds to the control voltage.

In still another embodiment, an apparatus is provided that includes an oscillator circuit and an oscillator control circuit. The oscillator control circuit includes a first transistor coupled to receive at a gate terminal a control voltage to control an oscillation frequency of the oscillator circuit. The oscillator control circuit further includes a second transistor providing a first current to be mirrored that is indicative of the control voltage. A first current carrying terminal of the second transistor is coupled to a power supply and a second current carrying terminal of the second transistor is coupled to the first transistor. The oscillator control circuit further includes a third transistor coupled to supply a mirrored current corresponding to the first current. The third transistor has a gate terminal coupled to a gate terminal of the first transistor and a first current carrying terminal of the third transistor coupled to the power supply. A second current carrying terminal of the third transistor is coupled to the oscillator circuit to supply to the mirrored current as a control current to control oscillation of the oscillator circuit. The oscillator control circuit further includes an amplifier circuit having a first amplifier input coupled to the second current carrying terminal of the second transistor, a second amplifier input coupled to a reference voltage, and an output coupled to gate terminals of the second and third transistors.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 7:
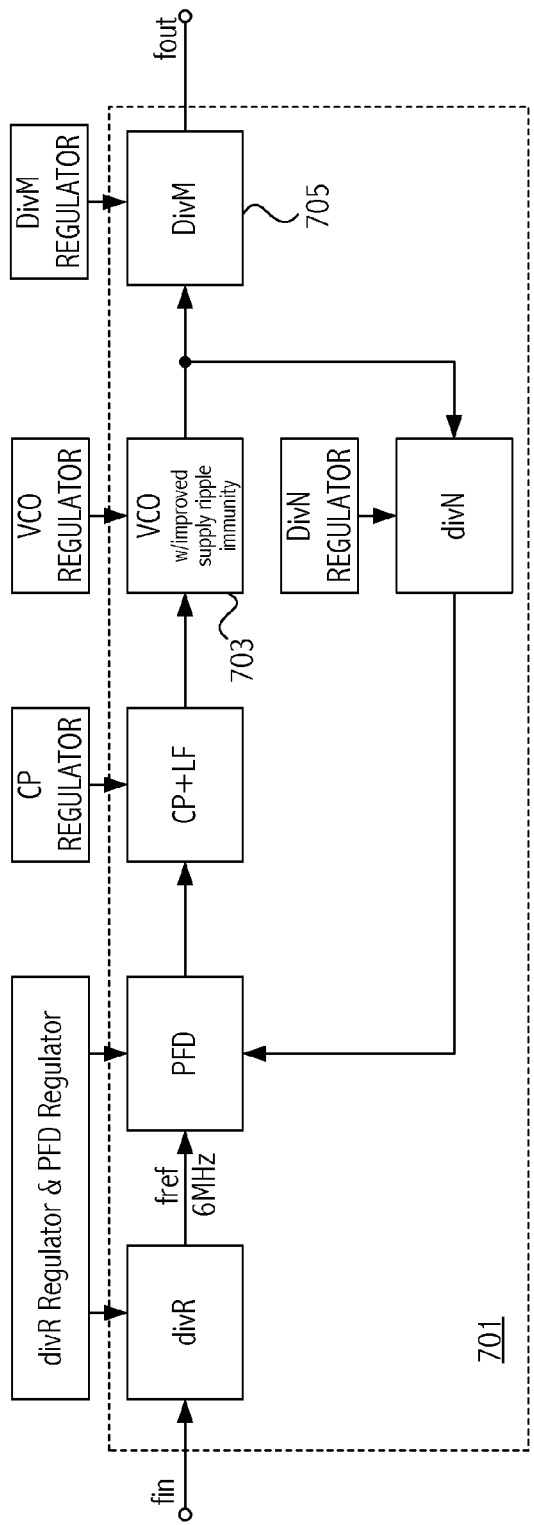
FIG. 7 illustrates a PLL having a VCO with improved supply ripple immunity.

In accordance with an embodiment of the invention, FIG. 7 depicts a PLL 701 that uses a ring-oscillator 703 with improved supply ripple immunity according to embodiments described herein. Embodiments of the oscillator described herein have increased power supply ripple immunity that results in lower VCO spurs. The use of a single level of regulation allows increased linear tuning range, which is especially desirable in today's low-voltage, fine-line CMOS technologies. A wide linear tuning range has two main benefits: (1) assuming the oscillator gain is kept constant, a wider frequency tuning range can be achieved; (2) assuming the frequency tuning range is kept constant, the oscillator gain can be reduced, which results in lower phase noise and lower supply induced spur from the blocks preceding the oscillator (mainly charge pump and loop-filter).

Figure 1:
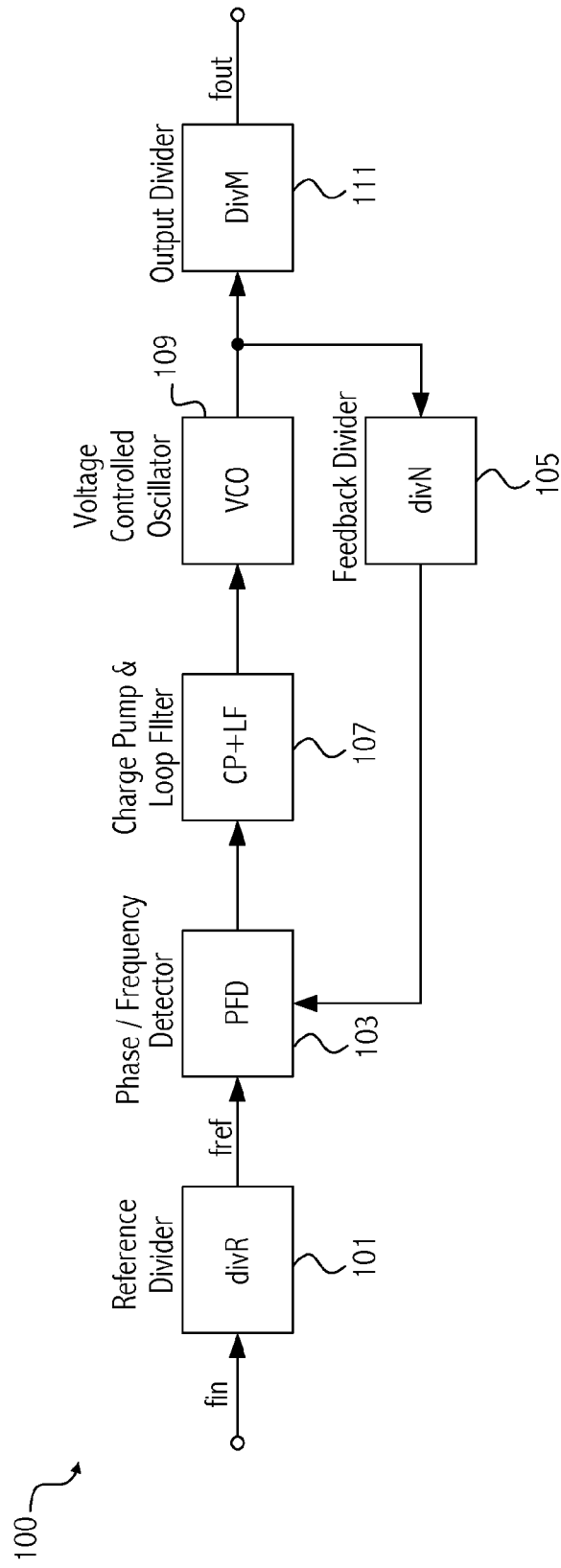
FIG. 1 illustrates a conventional phase-locked loop PLL.
Figures 2, 3:
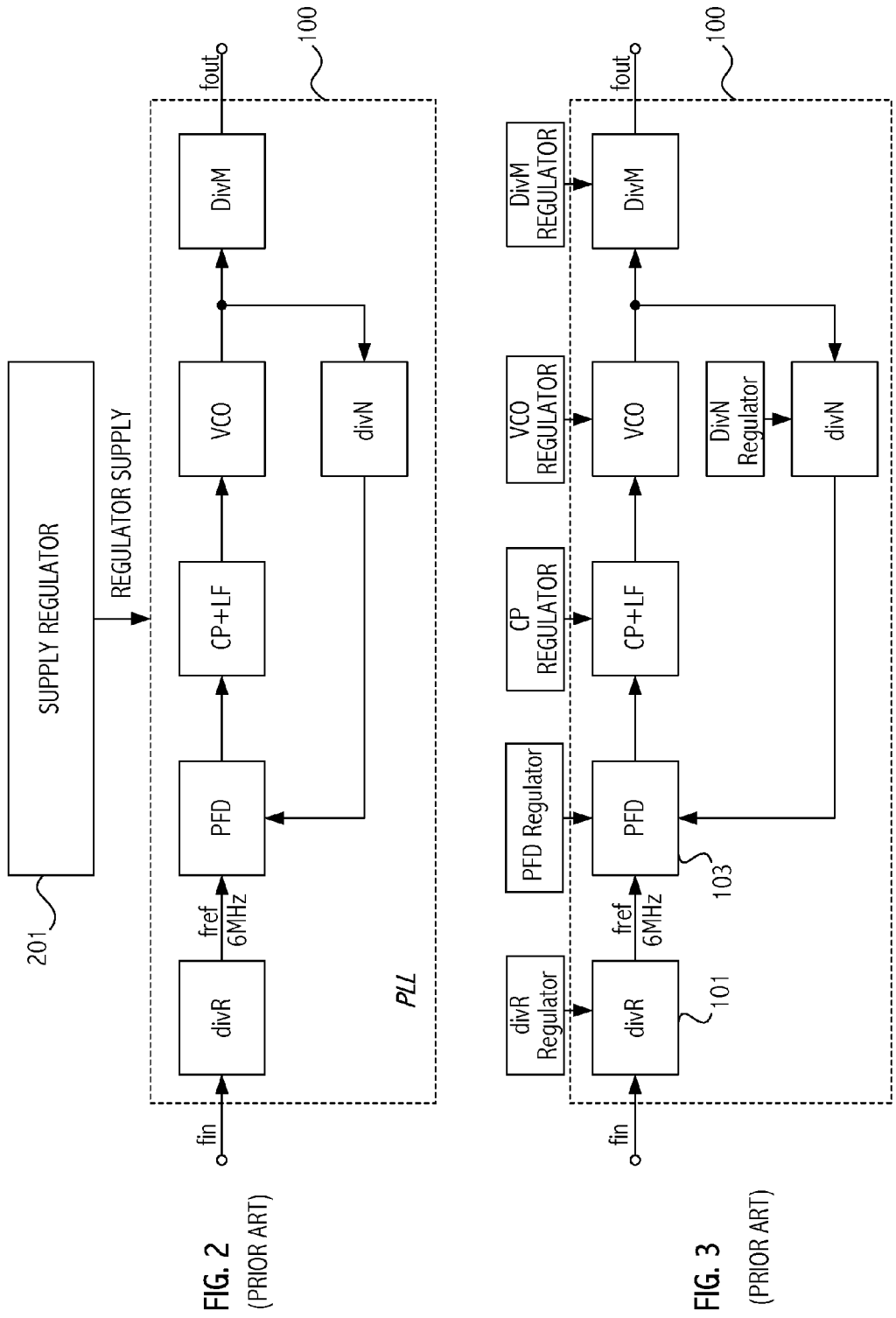
FIG. 2 illustrates a regulation scheme in which a single regulator is used for the entire PLL.
FIG. 3 illustrates a regulation scheme in which every PLL block has its own dedicated regulator.
Figure 4:
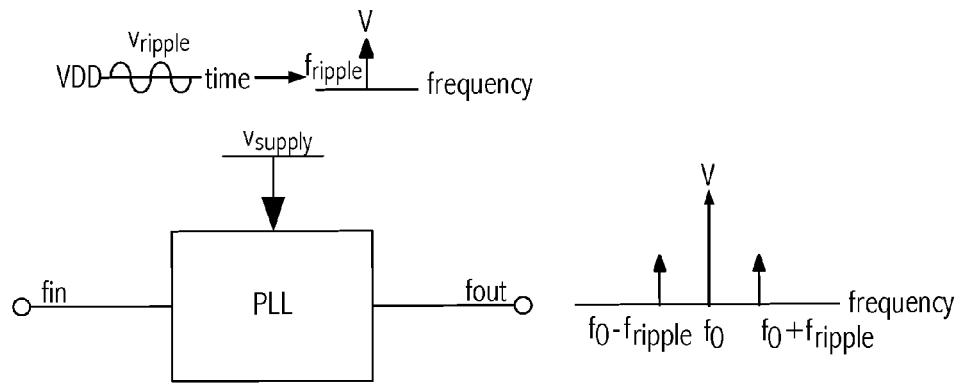
FIG. 4 illustrates the output clock spectrum of a PLL with frequency $f_0$ for a sinusoidal supply ripple at frequency $f_{ripple}$.
Figure 5:
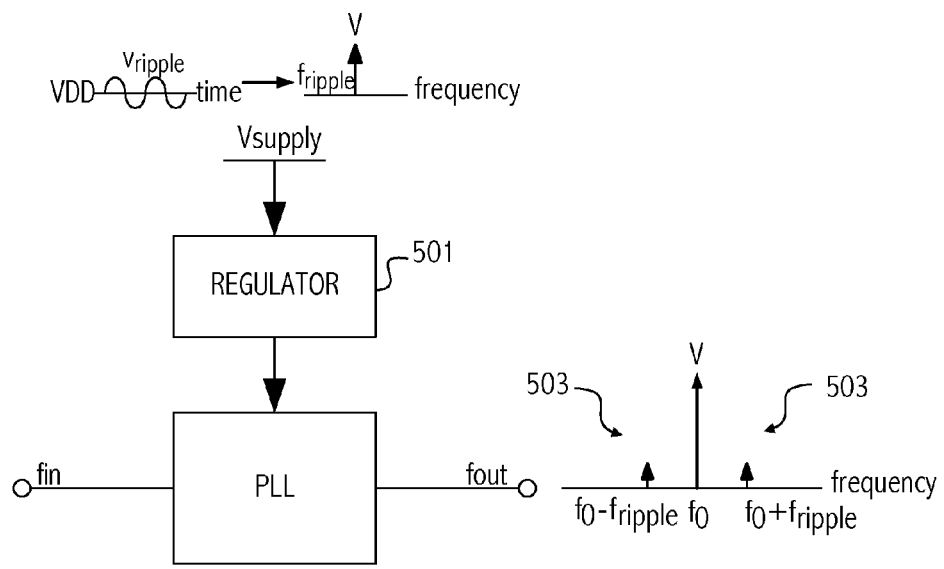
FIG. 5 illustrates that regulating the supply voltage reduces the output spurs as compared to the unregulated case of FIG. 4.
Figure 6:
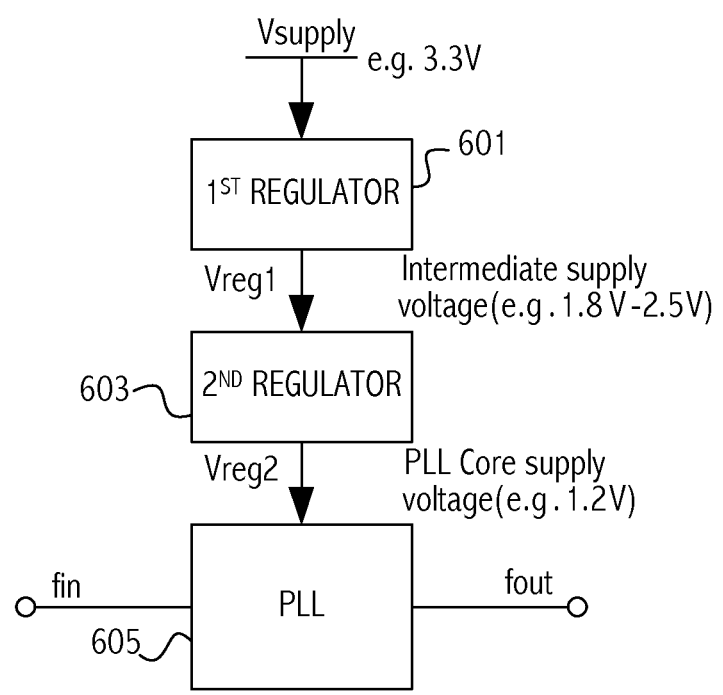
FIG. 6 illustrates a regulation scheme having more than one level of regulation.

FIG. 7 illustrates an embodiment of the invention utilizing a PLL with a distributed supply regulation scheme. Other embodiments may use various regulation schemes illustrated in FIGS. 2 and 3 or a different, partially distributed regulation scheme. In FIG. 7, although only one output divider 705 is shown supplying the output signal with a frequency of $f_{out}$, in many applications more than one output divider is needed to generate multiple frequencies.

Figure 8:
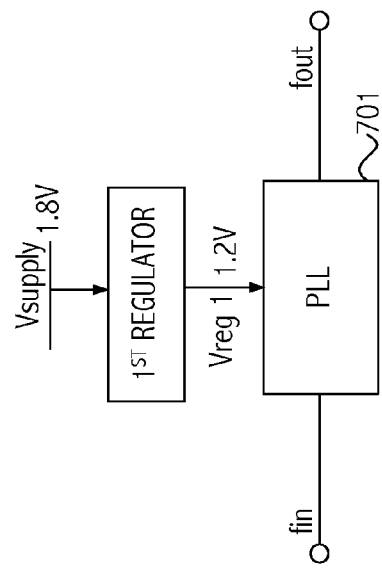
FIG. 8 illustrates a regulation scheme that can be utilized in an embodiment of the invention.

Using a ring-oscillator voltage controlled oscillator (VCO) with improved supply ripple immunity according to embodiments described herein also allows elimination of one level of regulation, depending on system spur requirements. With one level of regulation removed, a PLL according to an embodiment has similar supply ripple immunity compared to a PLL with two levels of regulation with a prior art ring oscillator. As a result, such a PLL can be operated from, e.g., a 1.8V supply rather than 3.3V supply resulting in significant power saving. Such a regulation scheme is shown in FIG. 8. In certain applications supply ripple requirements may be relaxed, allowing all the regulators for the VCO to be eliminated while achieving similar supply regulation to a one regulator embodiment without the improved VCO because the VCO with enhanced supply ripple immunity described herein has inherently good external noise immunity. Therefore, such a PLL can operate from, e.g., 1.2V, as opposed to the 1.8V of a conventional scheme, and thus save additional power and real estate.

For certain applications, such as TV tuner applications, a wide frequency tuning range is needed. Therefore, a ring oscillator-based VCO is chosen as opposed to an LC-based VCO. Wide tuning range VCOs, in general, suffer more from supply noise (particularly ripple).

Figure 9:
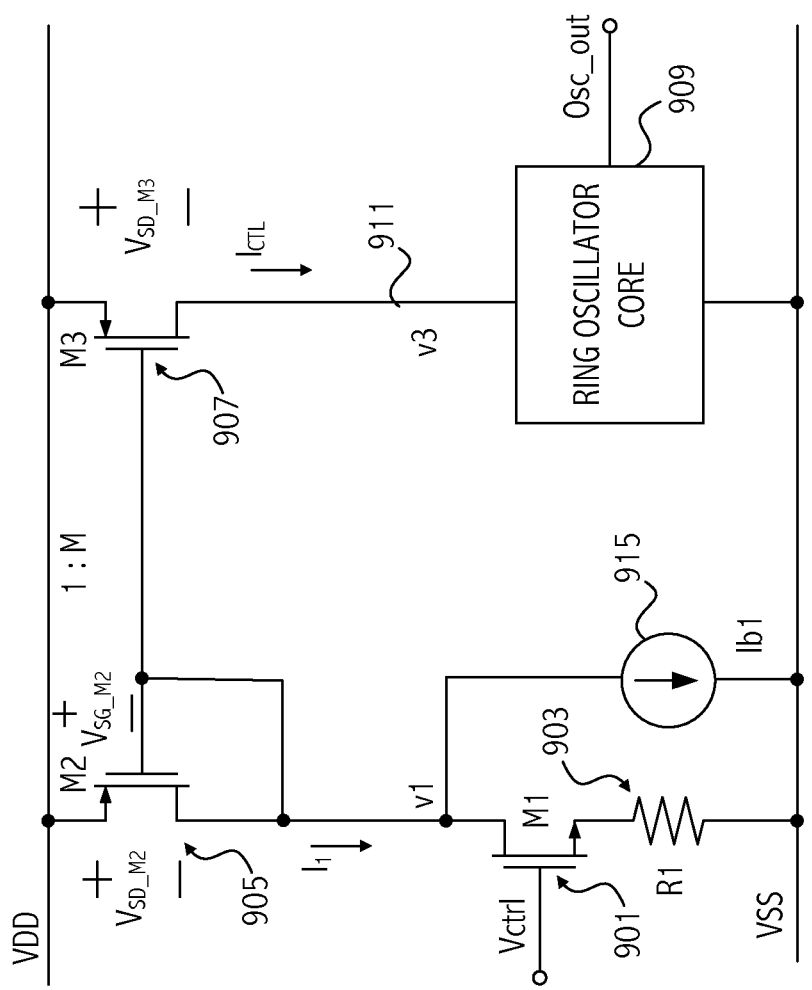
FIG. 9 illustrates a control circuit providing a control current to a ring oscillator.
Figure 10:
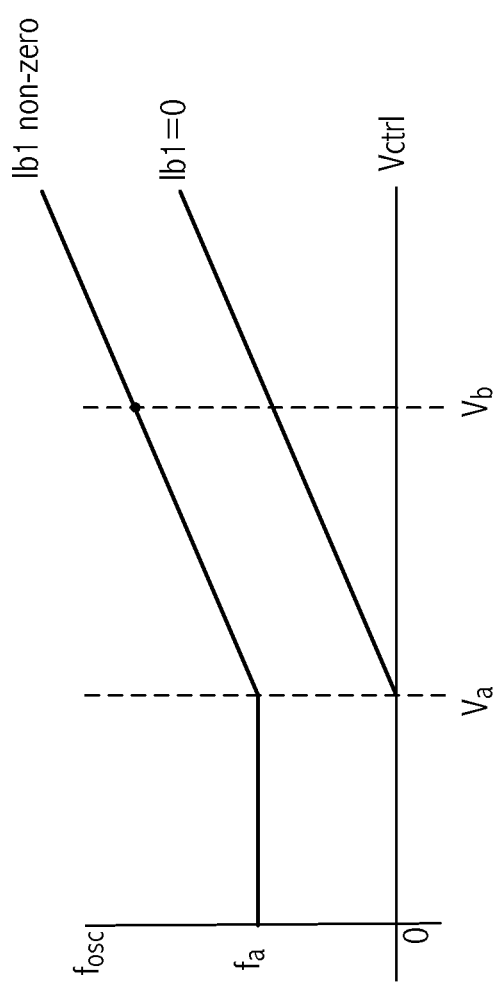
FIG. 10 illustrates the use of an offset current.

FIG. 9 provides a starting point to understand a VCO with improved supply immunity according to an embodiment. As shown in FIG. 9, a source degenerated input control device (transistor 901 (M1) source-degenerated by resistor 903 (R1)) converts input voltage (Vctrl) to current. Source degeneration linearizes the VCO gain curve so that the VCO frequency increases linearly with respect to changes in the control voltage. A current $I_1$ that is proportional to the input voltage (Vctrl) is then mirrored by the current mirror formed by transistors 905 (M2) and 907 (M3) with a gain of M. By modulating the drain current of transistor 907 (M3), the current controlled ring oscillator's frequency of oscillation is varied. The optional fixed current Ib1 is used to offset the nominal center frequency of the oscillator 909 as shown in FIG. 10 illustrating the two cases when Ib1 is zero and non-zero. The lower limit of Vctrl (Vctrl_min) is the threshold voltage of M1 (zero current case). With Vctrl at its lower limit, the minimum oscillating frequency is reached, which is set by the constant current source Ib1. The upper limit of the linear tuning range corresponds to Vctrl (Vctrl_max) equal to VDD−($V_{SG\_M2}$−$V_{Th\_}$M1) which is typically several hundred millivolts below VDD.

Referring back to FIG. 9, when the supply voltage (VDD) is perturbed by any ripple or noise, the drain voltage of M2 (v1) follows the perturbation in VDD directly since the drain current of M2 is fixed by VSS referred Vctrl. Thus, to a first order, $V_{SD\_M2}$ is constant. Thus, if VDD goes up or down, the drain voltage v1 follows going up or down, keeping $V_{SD\_M2}$ constant.

However, the supply voltage (v3) of ring oscillator core 901 is ground referred and therefore, to a first degree, is independent from VDD. Therefore, the drain voltage of M3 is fixed. As VDD moves, $V_{SD\_M3}$ is modulated. The drain current is a function of $V_{SD\_M3}$ and, as a result, the drain current of M3 (i.e., the supply current of the ring oscillator core) is modulated by VDD noise. The net result is a varying oscillation frequency, which manifests itself as spurs at the VCO output spectrum or increased jitter in a time domain waveform.

Figure 11:
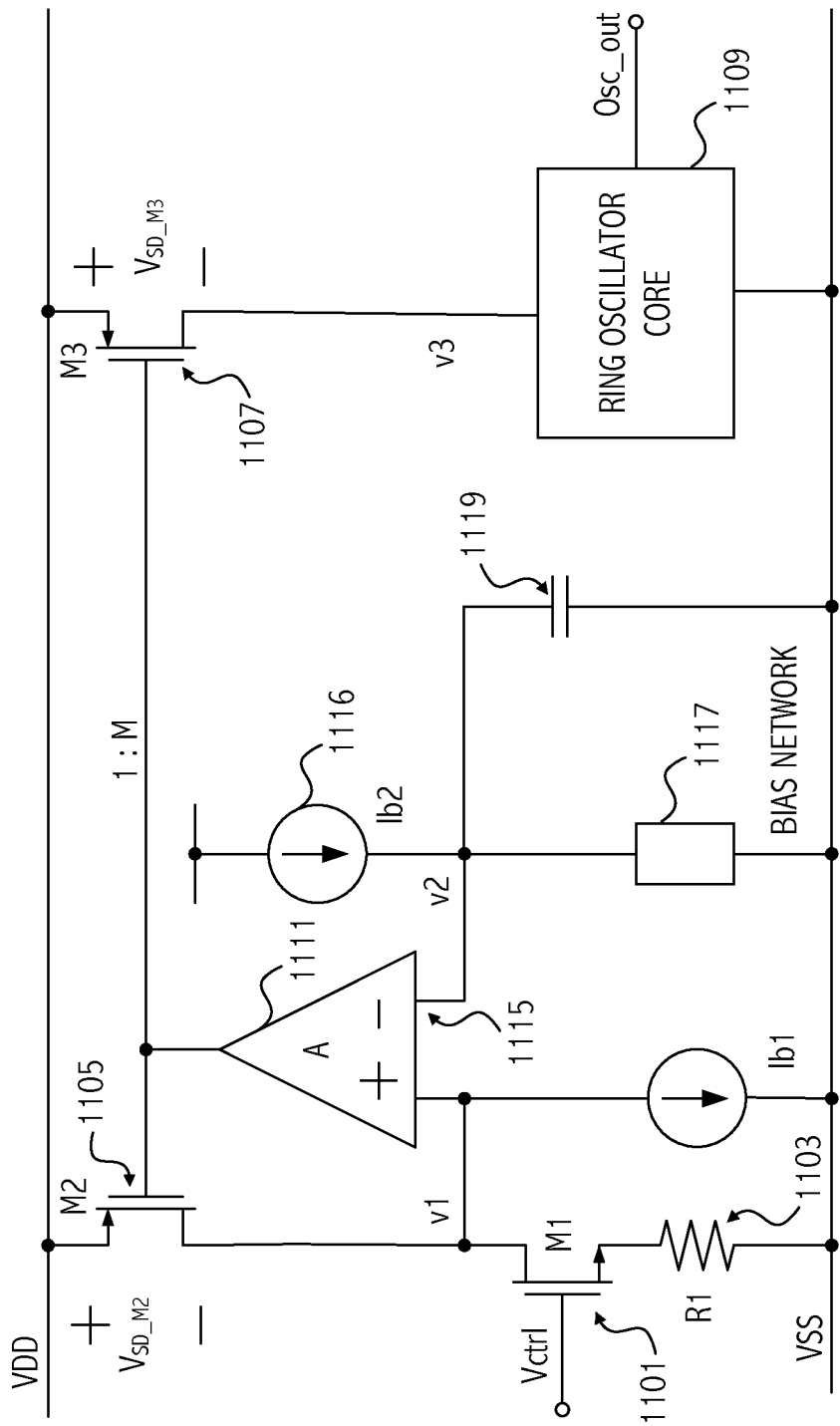
FIG. 11 illustrates an embodiment of a control circuit with improved immunity to power supply ripple.

Referring to FIG. 11, an embodiment is shown that reduces modulation in the oscillator current supplied by M3 in the presence of supply voltage ripple. In the embodiment shown in FIG. 11, the frequency tuning scheme is identical to that of the oscillator shown in FIG. 9. The input control voltage Vctrl is converted into current linearly using M1 1101 and R1 1103, and that current is mirrored by M2 1105 and M3 1107, and finally supplied to the ring oscillator 1109 to set its frequency. However, unlike the oscillator circuit shown in FIG. 9, as the supply voltage (VDD) is perturbed by any ripple or noise, the drain voltage (v1) of transistor 1005 (M2) does not follow VDD, but instead remains ground referred due to the feedback loop formed by amplifier 1111 and transistor 1105 (M2). Note that the reference terminal 1115 of amplifier 1111 is ground referred, set by the voltage formed on bias network due to Ib2. Typically the bias network is implemented using a resistor 1117 to generate an IR drop. A capacitor 1119 parallel to the resistor 1117 can be used to filter noise on the voltage v2. In some cases diode connected MOS transistors can be used instead of the resistors.

Since the drain voltage (v3) of transistor 1007 (M3) is also ground referred (as described earlier), incremental $V_{SD\_M2}$ is equal to incremental $V_{SD\_M3}$. If this condition is met, the current mirror formed by transistors 1105 (M2) and 1107 (M3) mirrors the current induced by Vctrl without modulation due to supply ripple. As a result, the ring oscillator frequency is not perturbed and spurs are suppressed significantly. Note that the gate voltage for transistors 1105 and 1107 provided by amplifier 1111 varies in response to supply voltage ripple.

Figure 12:
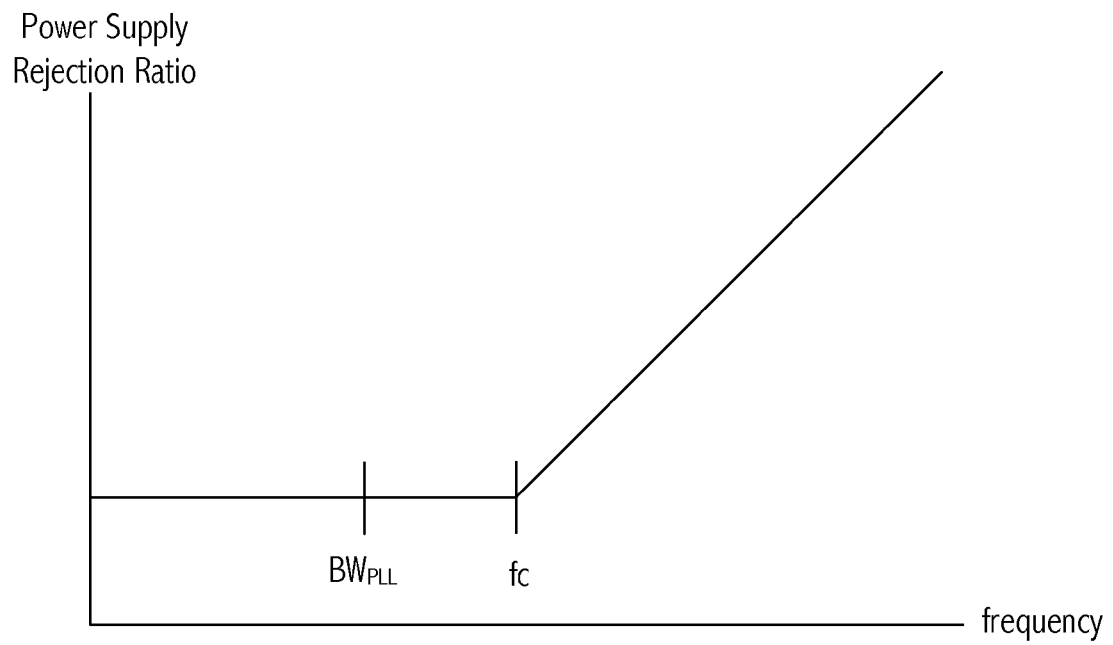
FIG. 12 illustrates a rejection curve associated with a VCO according to an embodiment of the invention.
Figure 13:
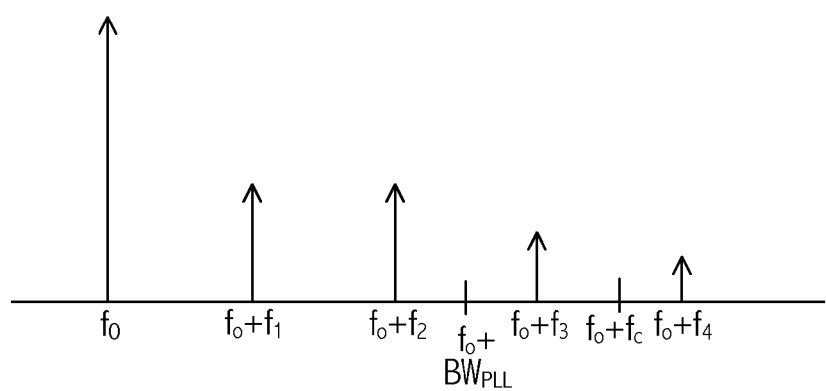
FIG. 13 illustrates exemplary spurs that may be associated with power supply ripple.

Of course, the ripple immunity provided by the circuit of FIG. 11 is not valid beyond a certain frequency in which v1 does not follow v2 due to reduced loop gain. This is illustrated in FIG. 12, which illustrates the VCO supply rejection curve with a corner frequency of $f_c$, above which the loop gain is reduced and v1 does not follow v2. In other words, above $f_c$, power supply ripple is not attenuated as much due to the reduced gain of the amplifier loop of FIG. 11. In FIG. 12, the bandwidth of a PLL using the VCO with improved power supply rejection is shown as $BW_{PLL}$. As long as the corner frequency ($f_c$) of the loop gain is sufficiently above the PLL bandwidth, e.g., several times the PLL bandwidth, the reduced loop gain does not degrade the performance for several reasons. FIG. 13 illustrates spurs present in PLL output at different frequencies. For ease of illustration, only those on one side of the oscillator frequency $f_o$ are shown. Those spurs due to power supply ripple above the PLL bandwidth are reduced by the PLL, e.g., at $f_0+f_3$ and $f_0+f_4$. For example, at twice the PLL bandwidth, the spurs are reduced by half. Those spurs that would otherwise be present in the PLL output at $f_0+f_1$ and $f_0+f_2$ and $f_0+f_3$ are below the corner of the VCO supply rejection curve shown in FIG. 12 and thus are reduced by the amplifier loop shown in FIG. 11. In addition, ripple present from switching power supplies tends to be flat up to a frequency of, e.g., 1 MHz, and low at high frequencies above that and thus the limitations on the loop gain do not typically cause concern with respect to spurs at such frequencies.

The lower limit of Vctrl (Vctrl_min) in the embodiment of FIG. 11 is the same as that of the VCO described with relation to FIG. 9. However, the upper limit of the linear tuning range is higher than in the embodiment of FIG. 11. Referring to FIG. 9, $V_{SG\_M2}=V_{SDSATM2}+|V_{TPM2}|$, where $V_{sDSATM2}$ is the saturation voltage of M2 and $|V_{TPM2}|$ is the magnitude of the threshold voltage. For a 1.8V VDD, the voltage at v1=VDD−$V_{SG\_M2}$, typically around 1V. Referring now to FIG. 11, as long as $V_{SD\_M2}<|V_{TPM2}|$, e.g., $V_{SD\_M2}$ is around 300-500 mV, Vctrl can be pushed all the way to VDD. Vref can be pushed as high as VDD−$V_{SDSATM2}$. The voltage v1 in the embodiment in FIG. 11 can be higher by $|V_{TPM2}|$ compared to v1 in FIG. 9. The upper limit of the linear tuning range corresponds to Vctrl (Vctrl_max) equal to VDD assuming v2 is set higher slightly higher than VDD less the threshold voltage of M2.

Figure 14:
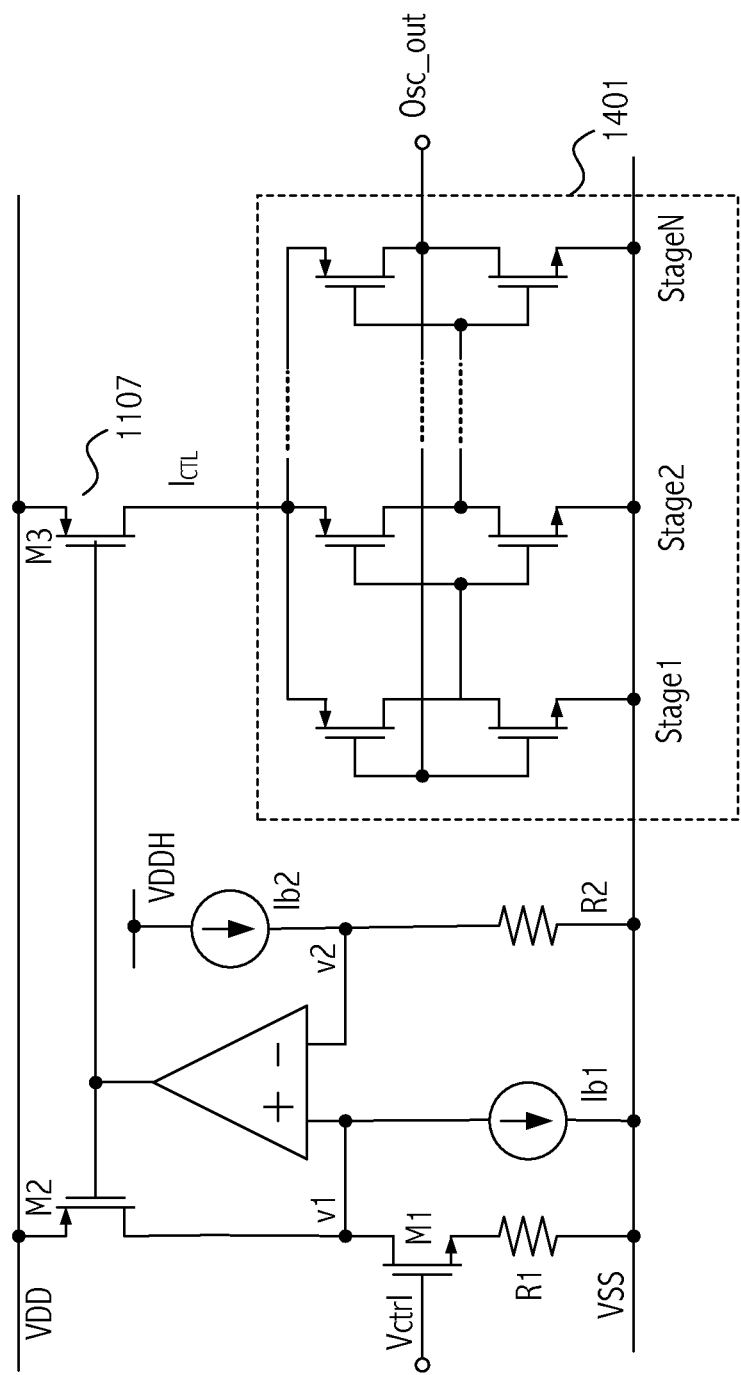
FIG. 14 illustrates an embodiment where a single control current source supplies each stage of the ring oscillator.

FIG. 14 illustrates an embodiment where the current $I_{CTL}$ from transistor 1107 (M3), is supplied to each stage of ring oscillator 1401. While the oscillator 1401 may be implemented by an odd number of simple inverters as shown, other embodiments may use other delay stages, such as differential or pseudo differential inverter stages. In the embodiment shown in FIG. 14, the bias network to generate the reference voltage v2 is implemented using a resistor R2.

Figure 15:
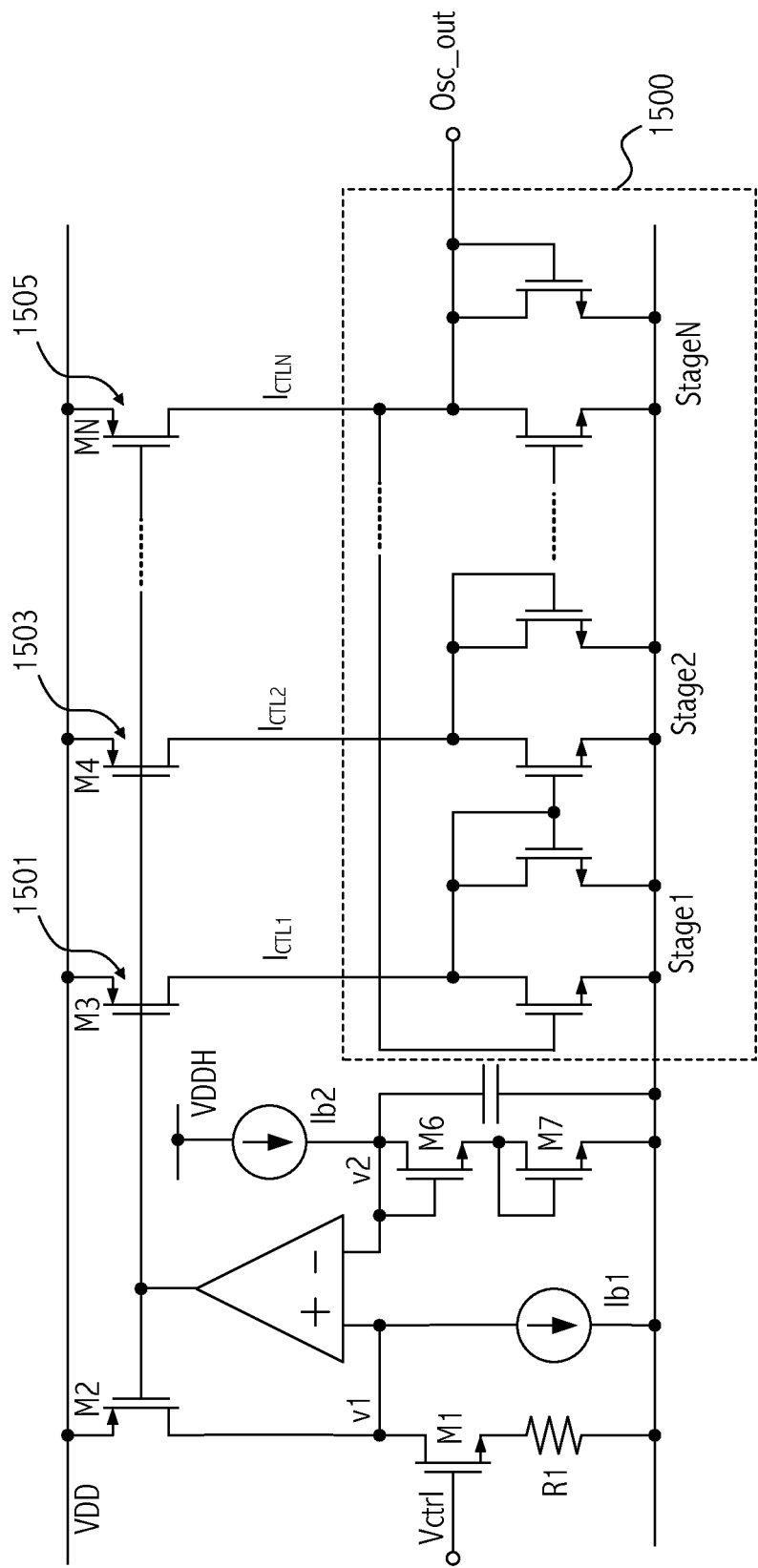
FIG. 15 illustrates an embodiment in which each stage of the ring oscillator is supplied by a different control current source.

Rather than supply all stages with one current, FIG. 15 shows an embodiment in which each stage of the ring oscillator 1500 is supplied by a different current source supplying control currents $I_{CTL1}, I_{CTL2}, I_{CTLN}$ from current sources transistors 1501, 1503, and 1505. Of course, other embodiments may utilize a current source to supply more than one of the stages of the ring oscillator, but not all of the stages depending upon system requirements. The bias network in the embodiment illustrated in FIG. 15 is implemented using two diode connected cascode NMOS transistors M6 and M7.

The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
    an amplifier circuit having a first input coupled to a reference voltage;
    a first transistor providing a first current that is indicative of a control voltage, a first current carrying terminal of the first transistor coupled to a first power supply node and a second current carrying terminal of the first transistor coupled to a second input of the amplifier circuit and having a gate terminal coupled to an output of the amplifier circuit;
    a second transistor coupled to supply a mirrored current corresponding to the first current, the second transistor having a gate terminal coupled to a gate terminal of the first transistor and the output of the amplifier circuit, the second transistor having a first current carrying terminal coupled to the first power supply node;
    an oscillator circuit coupled to a second current carrying terminal of the second transistor and having frequency of oscillation controlled according to the mirrored current, the reference voltage being independent of the second transistor;
    a third transistor coupled to receive the control voltage at a gate terminal, the third transistor having a first current carrying terminal coupled to the second input of the amplifier circuit and coupled to the second current carrying terminal of the first transistor; and
    a resistor coupled between a second power supply node and a second current carrying terminal of the third transistor, the resistor used to generate the first current such that it is linearly related to the control voltage, the resistor being coupled to receive the first current.

2. The apparatus as recited in claim 1 wherein the amplifier circuit is configured to adjust a gate voltage supplied to the gate terminals of the first and second transistors responsive to noise in a voltage signal supplied by the first power supply node.

3. The apparatus as recited in claim 1, wherein the amplifier forms a feedback loop to drive the second current carrying terminal of the first transistor to the reference voltage in the presence of noise in a voltage signal supplied by the first power supply node.

4. The apparatus as recited in claim 3 wherein the oscillator is a ring oscillator.

5. The apparatus as recited in claim 4 wherein the mirrored current is supplied to multiple stages of the ring oscillator.

6. The apparatus as recited in claim 4 further comprising at least one additional transistor providing another mirrored current of the first current, the at least one additional transistor having a gate terminal coupled to the gate terminal of the first transistor, a first current carrying terminal coupled to the power supply and a second current carrying terminal coupled to an oscillator stage different from another oscillator stage to which the second transistor is coupled.

7. The apparatus as recited in claim 1 wherein the control voltage operates in the linear region up to a voltage supplied by the first power supply node.

8. The apparatus as recited in claim 7 wherein source to drain voltage of the first transistor is less than a magnitude of the threshold voltage of the first transistor.

9. The apparatus as recited in claim 7 wherein the reference voltage has a value up to a value of the supply voltage minus a saturation voltage of the first transistor.

10. The apparatus as recited in claim 1 further comprising:
a reference voltage circuit to supply the reference voltage, the reference voltage circuit including a current source coupled to a first node and a resistance coupled between the first node and a ground node, the reference voltage being supplied on the first node and determined by a current of the current source and the resistance.

11. A method comprising:
supplying an input control voltage to a gate of a first transistor to control a frequency of oscillation of an oscillator circuit;
linearly converting the input control voltage to a first current using a resistor coupled between the first transistor and a first voltage supply node the first current flowing through a second transistor coupled between a second voltage supply node and the first transistor and flowing through the resistor;
mirroring the first current to generate a second current in a third transistor; and
adjusting a gate voltage of the second and third transistors in response to noise present in a voltage on the second voltage supply node to reduce variations in the second current from a desired value that corresponds to the control voltage;
wherein adjusting the gate voltage of the second and third transistors further includes,
supplying as a first input to an amplifier circuit a voltage at a node coupled to the first and second transistors;
supplying as a second input to the amplifier circuit a reference voltage, the reference voltage being independent of the third transistor; and
supplying an output of the amplifier circuit to respective gate terminals of the second and third transistors.

12. The method as recited in claim 11 further comprising:
supplying the second current to one or more stages of the oscillator circuit to control the frequency of oscillation of the oscillator circuit.

13. The method as recited in claim 12 further comprising:
mirroring the first current to generate a third current in a fourth transistor equal to the second current; and
supplying the third current to one or more additional stages of the oscillator circuit different from the one or more stages.

14. The method as recited in claim 11 further comprising:
supplying the first current to the resistor coupled between a ground node and a current carrying terminal of the first transistor.

15. The method as recited in claim 11 wherein the control voltage is linearly related to the first current in a range extending from a first voltage value up to a voltage supplied by the second voltage supply node.

16. The method as recited in claim 11 further comprising generating the reference voltage to have a maximum voltage value of the supply voltage minus a saturation voltage of the second transistor.

17. An apparatus comprising:
an oscillator circuit; and
an oscillator control circuit coupled to receive at an input to the oscillator control circuit a control voltage, the oscillator control circuit including,
a first transistor coupled to receive at a gate terminal the control voltage to control an oscillation frequency of the oscillator circuit;
a resistor coupled between a first power supply node and a current carrying terminal of the first transistor, the resistor coupled to receive a first current that is linearly related to the control voltage;
a second transistor coupled to provide the first current, a first current carrying terminal of the second transistor coupled to a second power supply node and a second current carrying terminal of the second transistor coupled to the first transistor;
a third transistor is coupled to supply a mirrored current corresponding to the first current, the third transistor having a gate terminal coupled to a gate terminal of the second transistor, a first current carrying terminal of the third transistor coupled to the second power supply node and a second current carrying terminal of the third transistor coupled to the oscillator circuit to supply the mirrored current as a control current to control oscillation of the oscillator circuit; and
an amplifier circuit having a first amplifier input coupled to the second current carrying terminal of the second transistor, a second amplifier input coupled to a reference voltage, and an amplifier output coupled to respective gate terminals of the second and third transistors, the reference voltage being independent of the third transistor.

18. The apparatus as recited in claim 17 wherein a voltage at the first amplifier input is driven to be equal to the reference voltage in the presence of ripple in voltage supplied by the second power supply node.

19. The apparatus as recited in claim 17 further comprising a phase-locked loop in which the oscillator circuit and the oscillator control circuit are disposed.

* * * * *